(12) United States Patent
Torres, Jr.

(10) Patent No.: US 9,631,784 B2
(45) Date of Patent: Apr. 25, 2017

(54) RECYCLED TIRE RUBBER BARRIER MODULAR SYSTEM

(71) Applicant: Jose Humberto Torres, Jr., Caguas, PR (US)

(72) Inventor: Jose Humberto Torres, Jr., Caguas, PR (US)

(73) Assignee: CROSS TECH, LLC, San Juan, PR (US)

(*) Notice: Subject to any disclaimer, the term of this patent is extended or adjusted under 35 U.S.C. 154(b) by 0 days.

(21) Appl. No.: 14/805,781

(22) Filed: Jul. 22, 2015

(65) Prior Publication Data

US 2015/0337508 A1    Nov. 26, 2015

Related U.S. Application Data

(60) Provisional application No. 62/002,240, filed on May 23, 2014.

(51) Int. Cl.

| | |
|---|---|
| *F21S 9/03* | (2006.01) |
| *B29C 39/10* | (2006.01) |
| *B29C 39/36* | (2006.01) |
| *H02S 40/38* | (2014.01) |
| *E01F 15/08* | (2006.01) |
| *B29C 35/02* | (2006.01) |
| *B29C 70/58* | (2006.01) |
| *B29C 39/26* | (2006.01) |
| *B29L 31/10* | (2006.01) |
| *B29K 21/00* | (2006.01) |
| *B29K 105/26* | (2006.01) |
| *B29K 421/00* | (2006.01) |

(52) U.S. Cl.
CPC .............. *F21S 9/032* (2013.01); *B29C 39/10* (2013.01); *B29C 39/26* (2013.01); *B29C 39/36* (2013.01); *B29C 70/58* (2013.01); *E01F 15/086* (2013.01); *E01F 15/088* (2013.01); *H02S 40/38* (2014.12); *B29C 35/02* (2013.01); *B29K 2021/00* (2013.01); *B29K 2105/26* (2013.01); *B29K 2421/006* (2013.01); *B29L 2031/10* (2013.01)

(58) Field of Classification Search
CPC ....... E01F 15/088; E01F 15/086; E01F 15/08; E01F 15/006; E01F 15/02; E01F 15/083; E01F 9/087
USPC .......................................................... 404/6
See application file for complete search history.

(56) References Cited

U.S. PATENT DOCUMENTS

| | | | | |
|---|---|---|---|---|
| 4,307,973 | A | * | 12/1981 | Glaesener ............. E01F 15/086 256/13.1 |
| 4,502,812 | A | * | 3/1985 | Zucker ................... E01F 15/025 256/13.1 |

(Continued)

*Primary Examiner* — Abigail A Risic
(74) *Attorney, Agent, or Firm* — Patentfile, LLC; Bradley C. Fach; Steven R. Kick (57) ABSTRACT

A recycled tire rubber barrier modular system comprising an elongated core of recycled rubber, polymer adhesive, and hardener; a base coupled to the elongated core; and two concave elongate walls which may be coupled to the elongated core and to the base. Additionally, two oppositely positioned sidewalls each of which may be coupled to the elongated core and to the base, and each sidewall may be joined to the concave elongate wall. The barrier system may further have a lateral hooking arm coupled to the elongated core above the concave elongate wall which is coupled to both sidewalls.

15 Claims, 10 Drawing Sheets

(56) References Cited

U.S. PATENT DOCUMENTS

| | | | |
|---|---|---|---|
| 5,122,008 A * | 6/1992 | Drews | B29B 17/0042 256/1 |
| 5,156,485 A | 10/1992 | Ivey et al. | |
| 5,217,318 A | 6/1993 | Peppel | |
| 5,286,136 A | 2/1994 | Mandish et al. | |
| 5,336,016 A * | 8/1994 | Baatz | B29B 17/0042 256/13.1 |
| 6,679,649 B1 | 1/2004 | Capolupo | |
| 6,913,415 B1 * | 7/2005 | Tagg | E01F 15/086 404/6 |
| 7,607,645 B2 | 10/2009 | Smith | |
| 7,618,212 B2 * | 11/2009 | Yodock, III | E01F 15/083 404/6 |
| 7,722,282 B2 | 5/2010 | Meidan | |
| 7,946,786 B1 | 5/2011 | Tullis et al. | |
| 8,807,864 B2 | 8/2014 | Kulkarni et al. | |
| 9,422,681 B2 * | 8/2016 | Smith | E01F 15/083 |
| 2004/0197140 A1 * | 10/2004 | Maleska | E01F 15/083 404/6 |
| 2011/0229261 A1 * | 9/2011 | Redlberger | E01F 15/083 404/6 |
| 2012/0128416 A1 * | 5/2012 | Sanchez De La Cruz | E01F 15/086 404/6 |
| 2014/0270937 A1 | 9/2014 | Kulkarni et al. | |
| 2015/0218763 A1 * | 8/2015 | Smith | E01F 15/083 404/6 |

* cited by examiner

RECYCLED TIRE RUBBER BARRIER MODULAR SYSTEM

CROSS REFERENCE TO RELATED APPLICATIONS

This application claims priority to and the benefit of the filing date of U.S. Provisional Application No. 62/002,240, filed on May 23, 2014, entitled "MODULAR RECYCLED TIRE RUBBER BARRIER APPARATUSES, METHODS, AND SYSTEMS", which is hereby incorporated by reference in its entirety.

FIELD OF THE INVENTION

This patent specification relates to the field of field of vehicular barriers. More specifically, this patent specification relates to modular vehicle barriers with improved safety characteristics.

BACKGROUND

It is often necessary to direct traffic around highway, bridge, and other construction sites through the use of one or more temporary or permanent barriers. Conventionally, barriers are made of concrete and may be fabricated on site, or they may be prefabricated as individual modules and later moved to a site.

The use of concrete barrier modules known as "Jersey barriers" are widespread and known to be both durable and heavy. The size and weight of Jersey barrier concrete modules is such that they may be placed directly upon most surfaces without requiring any additional anchoring to remain in place on the surface. The weight of the Jersey barrier modules, augmented by interconnecting other like modules together, provides inertial resistance and frictional resistance between their bases and the surface upon which they are placed.

Typically, a series of concrete Jersey barrier modules may be interconnected by a vertical tongue attachment with a vertical groove attachment located on opposite sides of each module. Another conventional way of interconnecting a series of Jersey barrier modules includes mechanical connections, such as nuts and bolts thru steel plates. These connections are often time consuming and unable to give upon an impact to one or more modules.

A distinctive disadvantage of concrete barrier modules is the inflexibility and rebounding characteristics of concrete. A vehicle impacting one or more of these concrete barrier modules, simply bounces off the rigid barrier and spins out of control into adjacent vehicles or into the path of vehicles traveling in the same direction causing a chain reaction of accidents.

Additionally, conventional concrete barrier modules do not give way upon impact and therefore the passengers of the impacting vehicle are often injured from the abrupt deceleration caused by a collision with these modules. By not aiding in reducing deceleration forces upon vehicle passengers, serious injury or even death can result from a direct impact with a concrete barrier module.

In an attempt to address some of these concrete barrier module problems, impact dispersing or yielding semi-rigid barriers have become common in the art. Impact dispersing barriers include semi-rigid plastic barrels filled with energy absorbing substances such as sand or water that deform upon impact. By placing these semi-rigid barriers around concrete barriers and other solid structures the deceleration forces may be dissipated upon impact. However, once deformed from an impact, the energy absorbing substances may erupt out of the semi-rigid plastic barrels and obscure the windshields of other traffic resulting in further collisions.

Another common form of impact dispersing barrier may be constructed from discarded automobile tires stacked or arranged in various configurations to absorb the impact of colliding vehicles. Other impact dispersing barriers may be constructed from discarded automobile tires attached together in other configurations. Unfortunately, discarded tires represent a fire hazard and a considerable health hazard as a breeding ground for pests.

Other attempts of forming impact dispersing barriers include the "Drew barrier" which is made from discarded tire pieces and a non-recyclable plastic material which are placed around a cage frame and into a mold. The contents of the mold are then cured to produce the Drew barrier. The Drew barrier also suffers disadvantages. For example, upon a harsh impact the barrier will become damaged, by a tear of the exterior side wall, or skin, around the center cage. It is very likely that an impacting vehicle will merely rip off the outside skin of the barrier and ricochet into traffic to cause further collisions.

Another attempt of forming an impact dispersing barrier comes from the Rubber vehicular impact barrier described in European Patent number 0639674, filed Aug. 15, 1994 by Baatz et al. However, this barrier has no opening on the bottom of the barrier for water to pass through, contributing to rain water accumulation on roads employing this barrier. Another disadvantage results from wire used in its construction that can be exposed creating an unsafe and risky scenario if the barrier is broken or damaged in an accident.

Therefore, a need exists for novel recycled tire rubber barrier modular systems that are able to aid in reducing deceleration forces upon a vehicle impacting with a barrier. There also exists a need for novel recycled tire rubber barrier modular systems that do not represent a fire hazard or a health hazard as a breeding ground for pests. There is a further need for novel recycled tire rubber barrier modular systems that will not expose dangerous materials such as sharp metal wire when damaged by an impact with a vehicle. Finally, there exists a need for novel recycled tire rubber barrier modular systems that will not contribute to rain water accumulation on roads employing a barrier.

BRIEF SUMMARY OF THE INVENTION

A recycled tire rubber barrier modular system is provided. In some embodiments, the system may comprise: an elongated core of recycled rubber, polymer adhesive, and hardener; a base coupled to the elongated core; a concave elongate wall which may be coupled to the elongated core and to the base; two oppositely positioned sidewalls each of which may be coupled to the elongated core and to the base, and each sidewall may be joined to the concave elongate wall; a lateral hooking arm coupled to the elongated core, coupled to the top of the concave elongate wall, and coupled to both sidewalls; a barrier joining device coupled to each sidewall; and a horizontal support centrally disposed within the elongated core and coupled to both barrier joining devices.

In further embodiments, a lateral hooking arm may comprise a plurality light emitting elements, and wherein the system may comprise a microcontroller configured to control the light emitted by the plurality light emitting elements.

In further embodiments, the system may comprise a male barrier joining device and a female socket barrier joining device, and the male barrier joining device of the system is configured to interlock with a female socket barrier joining device of another system.

According to one aspect consistent with the principles of the invention, a method of forming a recycled tire rubber barrier modular system is provided, the method comprising: mixing recycled rubber, rubber polymer adhesive, and hardener to form a mixture; filling a mold with the mixture; wherein the mold comprises a horizontal support coupled to a first barrier joining device and to a second barrier joining device; curing the mixture within the mold at a temperature of 80 to 100 degrees Fahrenheit and a pressure of 80 to 100 pounds per square inch for a time period of 10 to 20 minutes; and removing the cured mixture comprising the horizontal support coupled to a first barrier joining device and to a second barrier joining device from the mold.

In further embodiments, the mold may comprise a photovoltaic cell and a light emitting element in electrical communication with each other, and the horizontal support may comprise a cable coupled to a first barrier joining device and to a second barrier joining device.

In further embodiments, the mold may comprise a microcontroller, a photovoltaic cell, and a plurality light emitting elements, and the photovoltaic cell may be in electric communication with the microcontroller and the plurality light emitting elements, and the microcontroller may be configured to control the light emitted by the plurality light emitting elements.

In further embodiments, the mold may be configured to form a recycled tire rubber barrier modular system comprising: an elongated core of recycled rubber, polymer adhesive, and hardener; a base which may be coupled to the elongated core; a concave elongate wall which may be coupled to the elongated core and to the base; two oppositely positioned sidewalls each of which may be coupled to the elongated core, to the base, and to the concave elongate wall; a lateral hooking arm which may be coupled to the elongated core, to the top of the concave elongate wall, and to both sidewalls; a barrier joining device which may be coupled to each sidewall; and a horizontal support centrally disposed within the elongated core and which may be coupled to both barrier joining devices.

BRIEF DESCRIPTION OF THE DRAWINGS

Some embodiments of the present invention are illustrated as an example and are not limited by the figures of the accompanying drawings, in which like references may indicate similar elements and in which.

DETAILED DESCRIPTION OF THE INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 1:
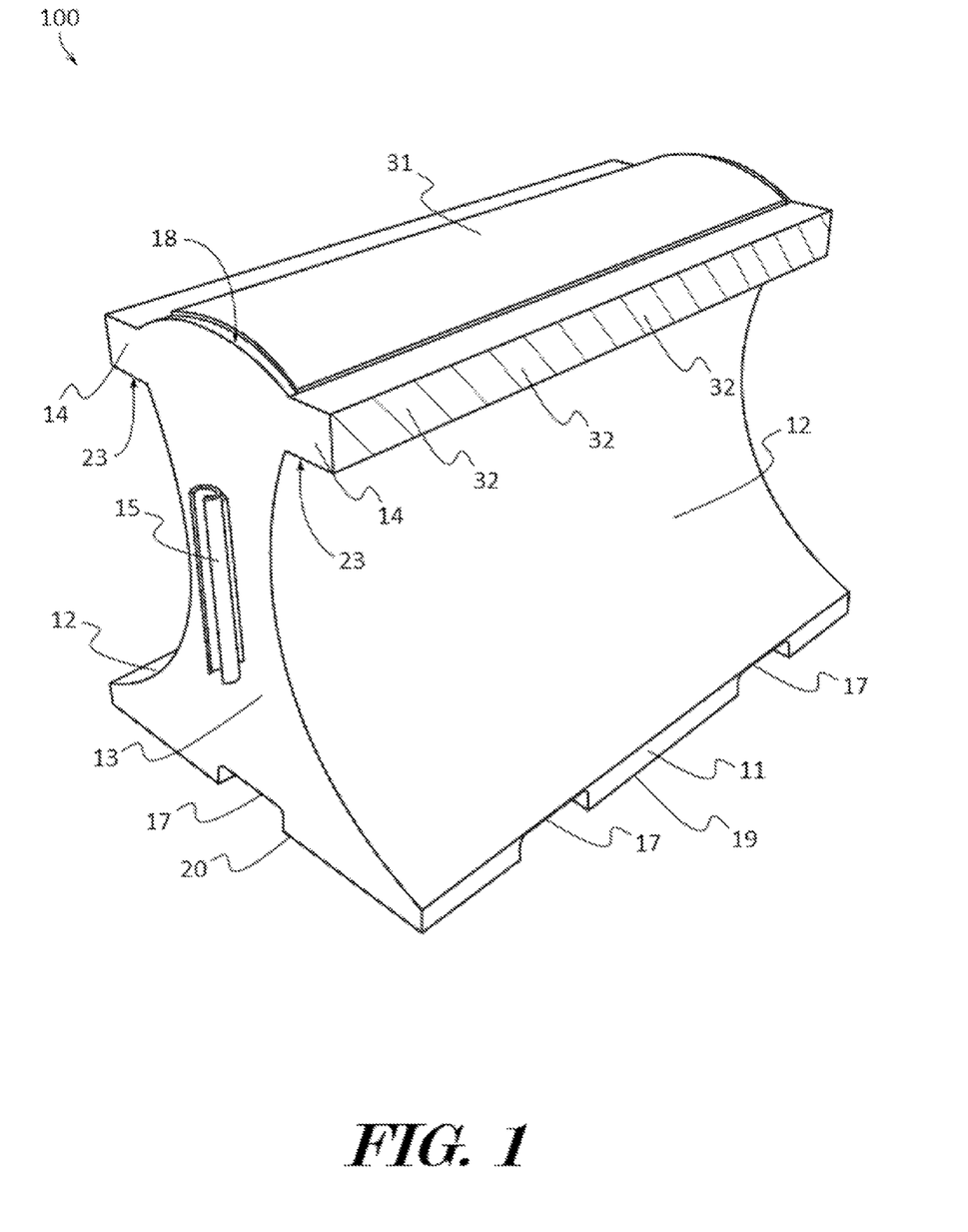
FIG. 1 depicts a perspective view of an example of a recycled tire rubber barrier modular system according to various embodiments described herein.

For purposes of description herein, the terms "upper", "lower", "left", "right", "rear", "front", "side", "vertical", "horizontal", and derivatives thereof shall relate to the invention as oriented in FIG. 1. However, one will understand that the invention may assume various alternative orientations and step sequences, except where expressly specified to the contrary. Therefore, the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

New recycled tire rubber barrier modular apparatuses, systems, and methods are discussed herein. In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention, and is not intended to limit the invention to the specific embodiments illustrated by the figures or description below.

The present invention will now be described by example and through referencing the appended figures representing preferred and alternative embodiments. FIG. 1 illustrates an example of a recycled tire rubber barrier modular system ("the system") 100 according to various embodiments. In this example, the system 100 comprises a base 11 coupled to two concave elongate walls 12. Two oppositely positioned sidewalls 13 (only one sidewall 13 is visible) may each be coupled to the base 11. Each sidewall 13 may also be coupled to both concave elongate walls 12. A lateral hooking arm 14 may be coupled to the top of each concave elongate wall 12 and also coupled to each sidewall 13. A barrier joining device 15 (also referred to as a "C-LOCK joining device") may be coupled to each sidewall 13 and a horizontal support 16 may be centrally disposed within the system 100 with the horizontal support 16 coupled to both barrier joining devices 15. In preferred embodiments, the base 11 may comprise one or more scups 17 configured to allow water and debris to pass under the system 100 while the base 11 is resting on a surface such as a road.

Figure 4:
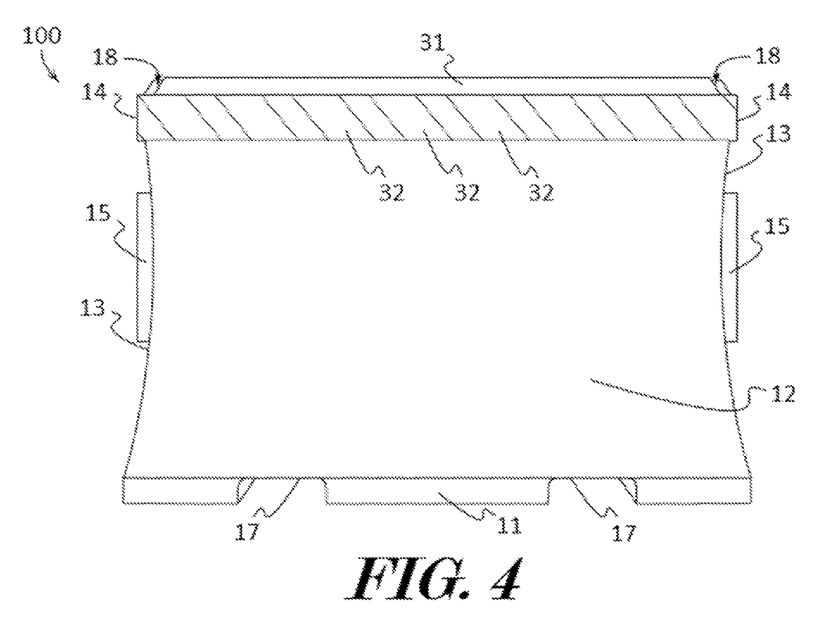
FIG. 4 depicts an elevation view of a major side of an example of a recycled tire rubber barrier modular system according to various embodiments described herein.
Figure 5:
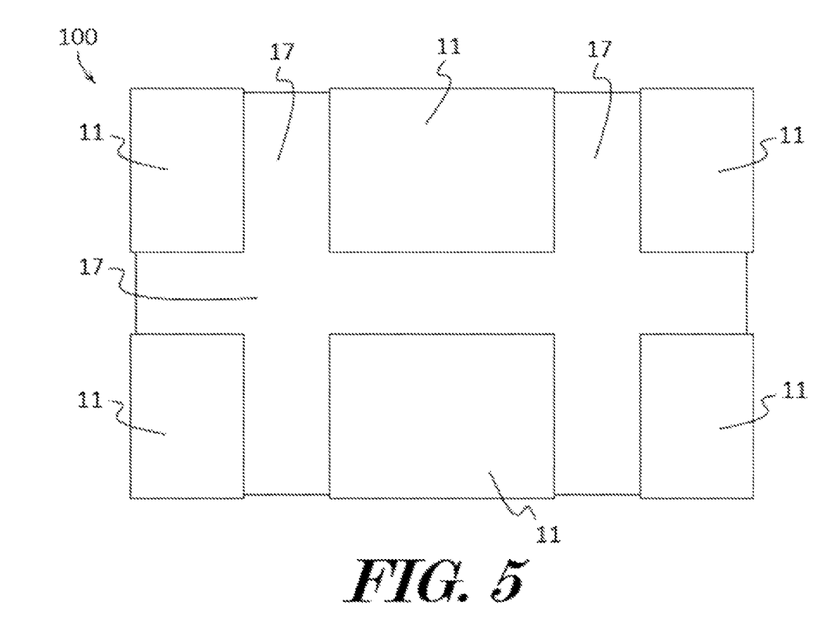
FIG. 5 illustrates a plan view of the bottom of an example of a recycled tire rubber barrier modular system according to various embodiments described herein.

In some embodiments, the base 11 may comprise a generally rectangular shape as perhaps best shown in FIG. 5. In further embodiments, a generally rectangular shaped base 11 may comprise two parallel elongate sides 19 and two parallel minor sides 20 which may be generally perpendicular to the two parallel elongate sides 19. In still further embodiments, a concave elongate wall 12 (FIGS. 1-4, 6, and 7) may be coupled to an elongate side 19 of the base 11 and a sidewall 13 (FIGS. 1-3, 6, 7, and 11) may be coupled to a minor side 20 of the base.

In some embodiments, the system 100 may comprise a convex upper surface 18 (FIGS. 1-4, and 6-8) which may be generally disposed on the top of the system 100. A convex upper surface 18 may comprise various convex radiuses which may generally extend away from the base 11. In other embodiments, a convex upper surface 18 may comprise a convex radius so large, that the convex upper surface 18 may appear to be generally planar. The optional convex upper surface 18 may be coupled to each lateral hooking arm 14 (FIGS. 1-4, 6, and 8) and to both sidewalls 13 (FIGS. 1-3, 6, 7, and 11). In preferred embodiments, the convex upper surface 18 may comprise one or more photovoltaic cells 31 (FIGS. 1, 2, 4, and 6-8, and 12), such as an array of photovoltaic cells 31, which may be configured to light emitting elements 32 (FIGS. 1, 2, 4, 6, 8, and 12), such as traffic lights or other indicator lights. In further embodiments, the convex upper surface 18 and/or portions of one or more lateral hooking arms 14 may comprise one or more photovoltaic cells 31. In still further embodiments, the convex upper surface 18 may comprise one or more photovoltaic cells 31 which may be configured to power sensors such as traffic sensors, impact sensors, or any other electronic device. In further embodiments, the convex upper surface 18, a portion of a concave elongate wall 12 (FIGS. 1-4, 6, and 7), and/or a portion of one or more lateral hooking arms 14 may comprise one or more reflective decals, light emitting elements 32, colored warning surfaces, or indicia configured to inform an observer of information.

A lateral hooking arm 14 may comprise an elongate protrusion which may extend out and away from a concave elongate wall 12 (FIGS. 1-4, 6, and 7) and optionally out and away from a convex upper surface 18 (FIGS. 1-4, and 6-8). Generally, a lateral hooking arm 14 may extend the length of all or a portion of a concave elongate wall 12 and/or all or a portion of an elongate side 19 of the base 11. In some embodiments, a lateral hooking arm 14 may be coupled to the top of a concave elongate wall 12 allowing the lateral hooking arm 14 to be positioned approximately two to ten feet above the base 11. In further embodiments, a lateral hooking arm 14 may be coupled to the top of a concave elongate wall 12 allowing the lateral hooking arm 14 to be positioned approximately three to five feet above the base 11, such as to include the height of the average vehicle bumper from a road surface. In some embodiments, a lateral hooking arm 14 may comprise an elongate rectangular prism shape. In other embodiments, a lateral hooking arm 14 may comprise an elongate cylindrical shape, an elongate triangular prism shape, or any other shape or combination of shapes. In alternative embodiments, a lateral hooking arm 14 may comprise a plurality of linearly aligned protrusions which in total may from the elongated protrusion of a lateral hooking arm 14. In preferred embodiments, a lateral hooking arm 14 may comprise a hook engagement surface 23 which may provide a surface for a crane or other hooking device to lift and position the system 100.

Figure 2:
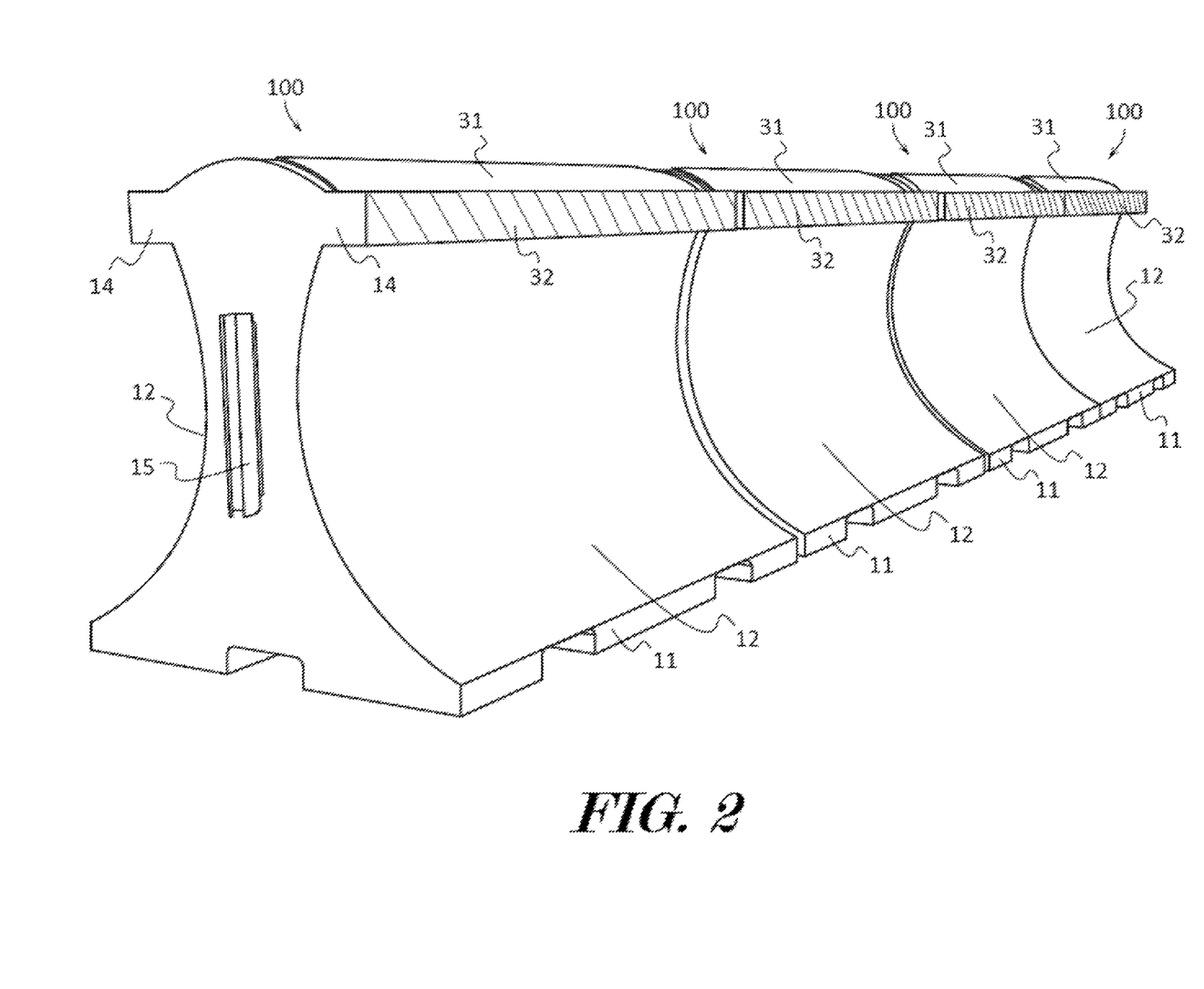
FIG. 2 illustrates a perspective view of an example of a series of recycled tire rubber barrier modular systems according to various embodiments described herein.

FIG. 2 illustrates a perspective view of an example of a series of recycled tire rubber barrier modular systems 100 according to various embodiments described herein. In this example, four recycled tire rubber barrier modular systems 100 positioned in series with each other. In some embodiments, two or more systems 100 may be positioned in series with each other with each system 100 secured to one but preferably two other systems 100. The systems 100 may be secured together by optionally interlocking a barrier joining device 15 of a first system 100 to the barrier joining device 15 of a second system 100, thereby generally aligning a concave elongate wall 12 of the first system 100 with the concave elongate wall 12 of the second system 100 as shown in FIG. 2. A series of systems 100 may be aligned and configured so that the concave elongate walls 12 of the systems 100 may be arranged in linear, curved, angled or a combination of linear, angled, and/or curved serial arrangements.

Figure 3:
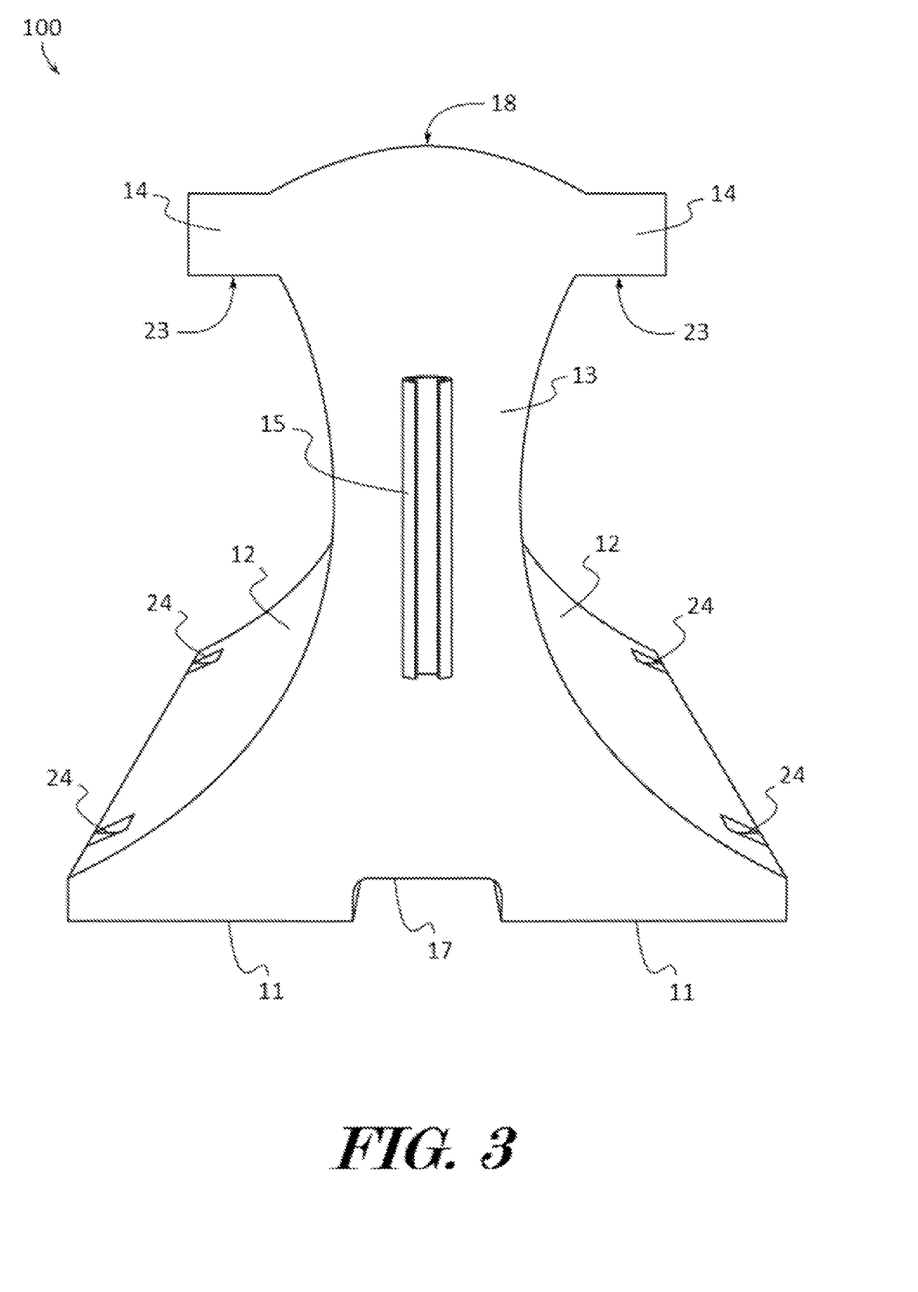
FIG. 3 shows an elevation view of a minor side of an example of a recycled tire rubber barrier modular system according to various embodiments described herein.

FIG. 3 shows an elevation view of a minor side, the majority of which is formed by a sidewall 13, of an example of a recycled tire rubber barrier modular system 100 according to various embodiments described herein. In this example, the concave shape of the two concave elongate walls 12 can be seen. A concave elongate wall 12 may form a concave elongate surface which extends from an elongate side 19 of the base 11 to a hook engagement surface 23 of a lateral hooking arm 14.

A concave elongate wall 12 may comprise various concave radiuses which are configured to direct an object impacting a concave elongate wall 12 up and into a lateral hooking arm 14 thereby arresting the motion of the object in a gradual deceleration. In other embodiments, the concave elongate walls 12 may comprise various concave radiuses which are configured to direct the blast forces from an explosion impacting a concave elongate wall 12 up and into a lateral hooking arm 14 thereby arresting the motion of the blast forces by causing them to curl back on themselves.

In this embodiment, the system 100 comprises two concave elongate walls 12 and two sidewalls 13 which may comprise a planar shape. In other embodiments, the system 100 may comprise one concave elongate wall 12, one lateral hooking arm 14, and three sidewalls 13. In further embodiments, the system 100 may comprise three concave elongate walls 12, three lateral hooking arms 14, and one sidewall 13. In still further embodiments, the system 100 may comprise four concave elongate walls 12, four lateral hooking arms 14, and no sidewalls 13.

FIG. 4 depicts an elevation view of a major side, the majority of which is formed by a concave elongate wall 12, of an example of a recycled tire rubber barrier modular system 100 according to various embodiments described herein. As depicted in FIG. 4, the system 100 may comprise a first barrier joining device 15 coupled to a first sidewall 13 and a second barrier joining device 15 coupled to a second sidewall 13. In other embodiments, the system 100 may comprise one or more barrier joining devices 15 coupled to one or more sidewalls 13.

In some embodiments and in the present example, the base 11 may comprise one or more scups 17 which are configured to allow water and debris such as dirt, plant material, and refuse to pass underneath of the system 100 and off of the surface upon which the system 100 is positioned. In preferred embodiments, the scups 17 may be approximately ten inches in width and three inches in height. In other embodiments, one or more of the scups 17 may be between three to twenty four inches in width and one and ten inches in height. A scup 17 may form a depression or recess which may extend up into the base 11, optionally one or more sidewalls 13, and/or optionally one or more concave elongate walls 12.

In the embodiment, depicted in FIG. 4, the scups 17 comprise a substantially rectangular prism shape when positioned on a generally flat surface such as a road, sidewalk, or other ground surface. In other embodiments, the one or more scups 17 may comprise a cube type, triangular prism type, hexagonal prism type, tetrahedron type, square pyramid type, conical, spherical, cylindrical, or any other 3D geometric shapes including combinations of shapes configured to allow water and debris such as dirt, plant material, and refuse to pass underneath of the system 100 and off of the surface upon which the system 100 is positioned.

FIG. 5 illustrates a plan view of the bottom of an example of a recycled tire rubber barrier modular system 100 according to various embodiments described herein. In this embodiment, the system 100 comprises two generally parallel positioned scups 17 which are generally perpendicularly bisected by a third scup 17. In other embodiments, one or more scups may not intersect with another scup 17. In further embodiments, the base 11, optionally one or more sidewalls 13 (FIGS. 1-3, 6, 7, and 11), and/or optionally one or more concave elongate walls 12 (FIGS. 1-4, 6, and 7) may comprise any number of scups 17 which may be positioned anywhere to allow water and debris such as dirt, plant material, and refuse to pass underneath of the system 100 and off of the surface upon which the system 100 is positioned.

Figure 6:
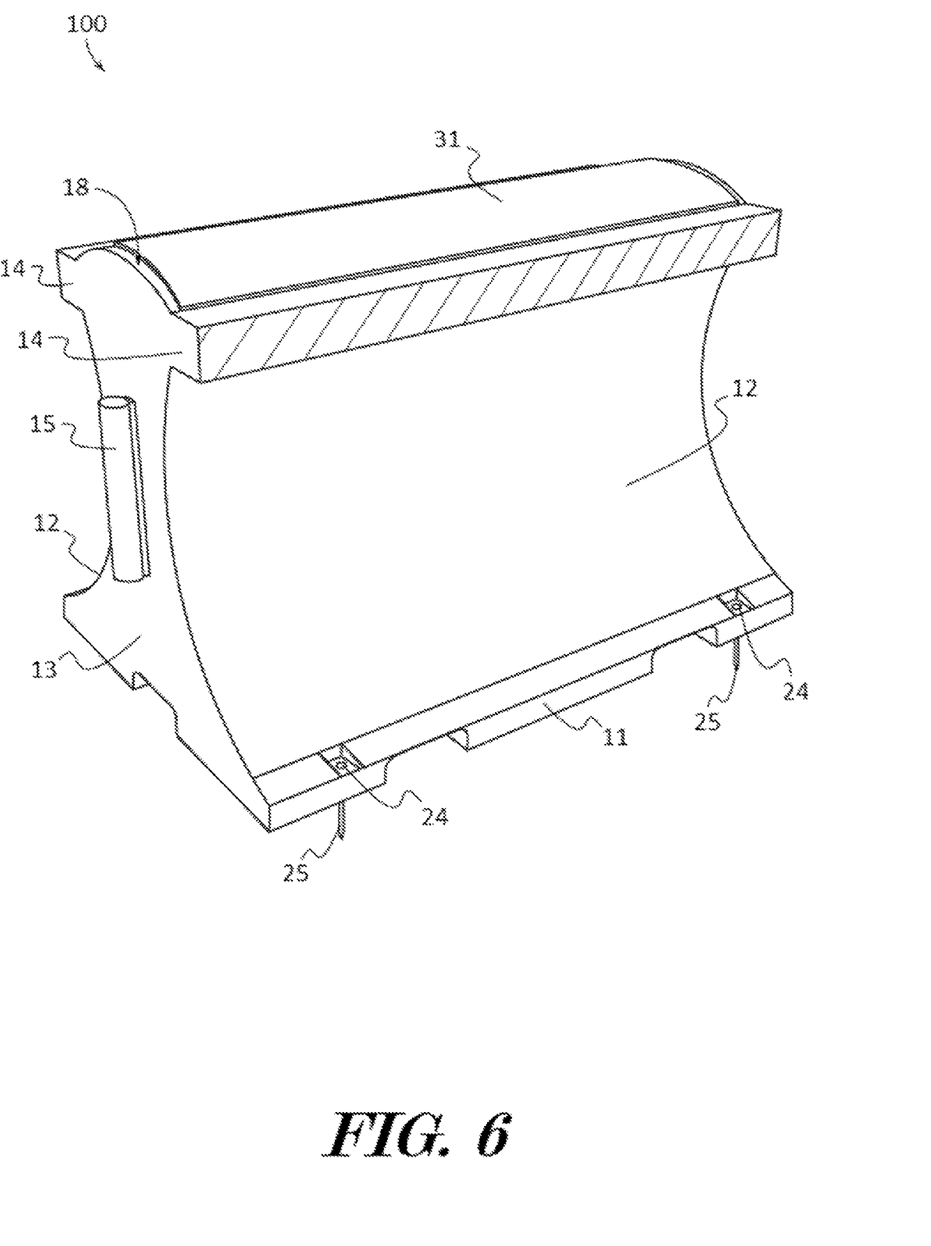
FIG. 6 shows a perspective view of an example of another embodiment of a recycled tire rubber barrier modular system according to various embodiments described herein.

FIG. 6 shows a perspective view of an example of another embodiment of a recycled tire rubber barrier modular system 100 according to various embodiments described herein. In this embodiment, the base 11 comprises two fastener apertures 24 positioned at the junction of the base 11 and a concave elongate sidewall 12. A fastener aperture 24 may comprise an aperture which allows a fastener 25 to pass through portions of the system 100 and into the surface below the system 100. In this manner, one or more fasteners 25 such as anchor screws, ground spikes, or any other suitable fastener may be used to secure a system 100 to a surface to prevent movement of the system 100 across the surface. In other embodiments, one or more break away fasteners may be inserted through a fastener aperture 24 and be used secure the system 100 to a surface but allow the system 100 to move across a surface when impacted by an object or explosive blast. In further embodiments, the system 100 may comprise one, two, three, five, six, seven, eight, or more fastener apertures 24 which may be positioned anywhere along the base 11, one or more concave elongate walls 12, and/or one or more sidewalls 13.

Figure 7:
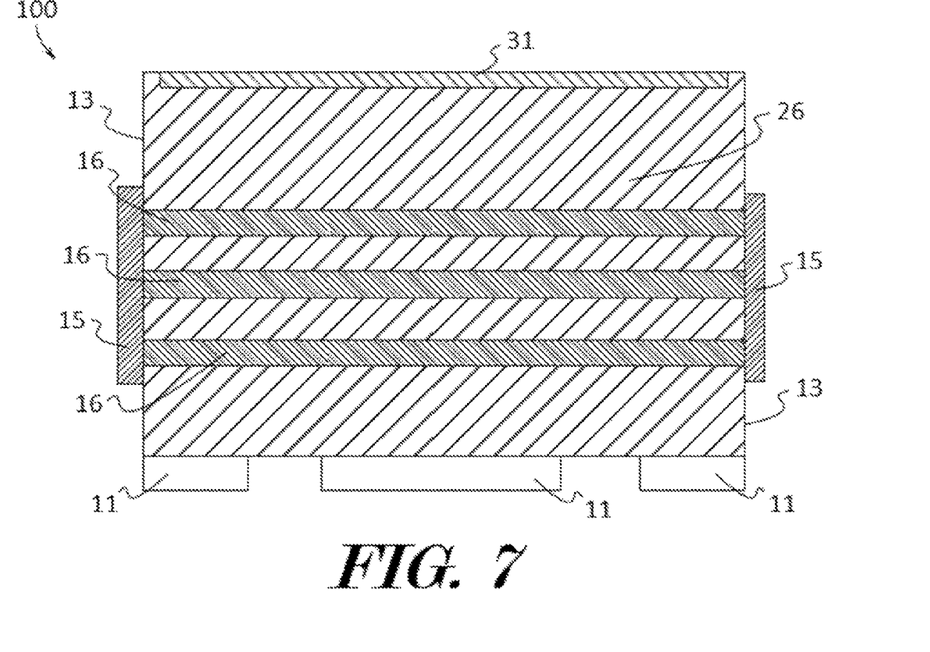
FIG. 7 depicts a sectional, through line 7-7 shown in FIG. 3, elevation view of an example of a recycled tire rubber barrier modular system according to various embodiments described herein.
Figure 8:
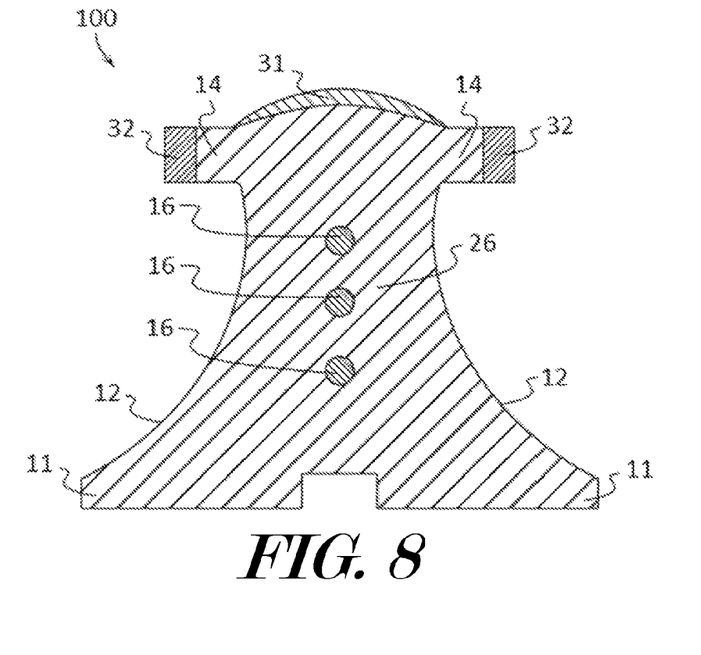
FIG. 8 illustrates a sectional, through line 8-8 shown in FIG. 4, elevation view of an example of a recycled tire rubber barrier modular system according to various embodiments described herein.

Turning now to FIG. 7, a sectional, through line 7-7 shown in FIG. 3, elevation view of an example of a system 100, and to FIG. 8, a sectional, through line 8-8 shown in FIG. 4, elevation view of an example of a system 100 according to various embodiments described herein are depicted. In this embodiment, a system 100 may comprise three horizontal supports 16. Each end of a horizontal support 16 may be coupled, such as with heat bonding, fasteners, and the like, to a barrier joining device 15 so that the horizontal support 16 may extend the length of a major side and therefore the length of a concave elongate wall 12. In other embodiments, the system 100 may comprise one, two, four, five, or more horizontal supports 16 with one or more of the horizontal supports 16 joined to one or more barrier joining devices 15. The horizontal supports 16 are preferably positioned centrally or centrally disposed within the system 100.

In preferred embodiments, the system 100 may comprise an elongated core 26 onto which the components of the system 100, such as the base 11, a concave elongate wall 12, a sidewall 13, a lateral hooking arm 14, a horizontal support 16, and an optional scup 17, may be coupled to. An elongated core 26 may form or provide the structural support for the components and in some embodiments, the components may be coupled to the elongated core 26 by being integrally formed or molded into or onto the elongated core 26. In further embodiments, the components of the system 100, which includes the elongated core 26, may be made from or comprise recycled automotive or vehicular tire rubber, such as approximately 97 percent ground tire rubber, and approximately three percent of less of a polymer adhesive. In other embodiments, the majority of system 100 may be made from and comprise approximately 97 to 99 percent ground tire rubber with a polymer adhesive and an optional hardener comprising the remainder.

Figure 9:
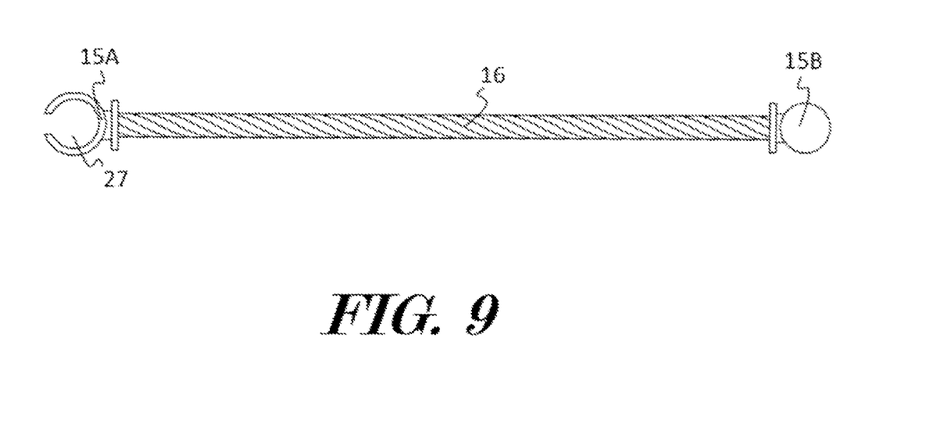
FIG. 9 shows a plan view of the top of an example of horizontal support with a barrier joining device coupled to each end of the horizontal support according to various embodiments described herein.
Figure 10:
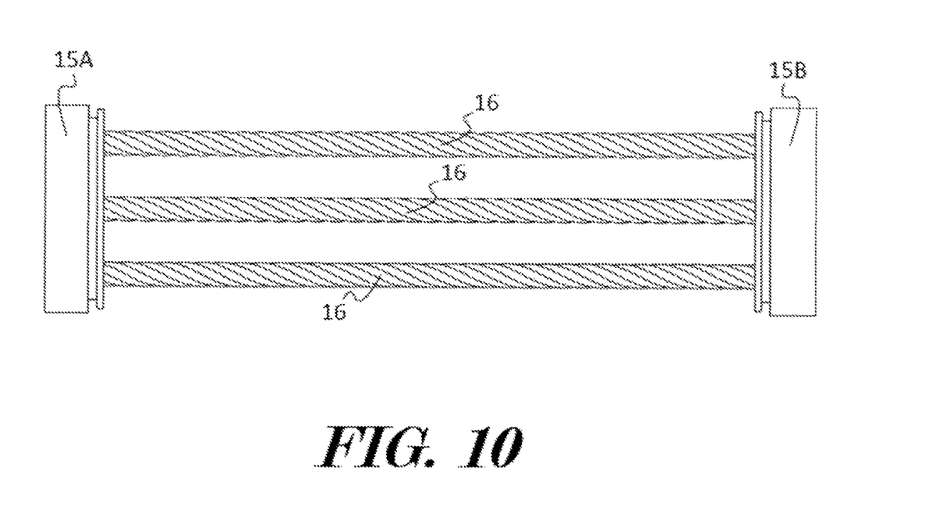
FIG. 10 depicts a side elevation view of an example of three horizontal supports with each end of the horizontal supports coupled to a barrier joining device according to various embodiments described herein.

FIG. 9 shows a plan view of the top of an example of horizontal support 16 with a barrier joining device 15 attached to each end of the horizontal support 16 and FIG. 10 depicts a side elevation view of an example of three horizontal supports 16 with each end of the horizontal supports 16 coupled to a barrier joining device 15 according to various embodiments described herein. In these and preferred embodiments, a horizontal support 16 may comprise an elongated cylindrical shape. In other embodiments, a horizontal support 16 may comprise an elongated rectangular prism, triangular prism, hexagonal prism, or any other 3D geometric shape including combinations of shapes. A horizontal support 16 may be made from or comprise various metal alloys such as steel alloy braided cables, aluminum braided cables, metal alloy pipes, metal alloy bars, or any other suitable substantially hard or flexible material including rubber braided cables, carbon fiber braided cables, hard plastics braided cables, hard rubbers braided cables, and the like.

As perhaps best shown in FIGS. 7, 8, and 10 which illustrate an example of three horizontal supports 16 attached to two barrier joining devices, when positioned within an system 100 (FIGS. 1-8), one or more horizontal supports 16 may function as a second barrier against object impacts and explosion blasts. Additionally, the one or more horizontal supports 16 may provide structural support to reinforce or strengthen the elongated core 26 of the system 100. In alternative embodiments, one or more of the horizontal supports 16 may not be joined directly to a barrier joining device 15 and instead be joined to one or more other horizontal supports 16 which are in turn joined to one or more barrier joining devices 15. A horizontal support 16 may be coupled to a barrier joining device 15 or to another horizontal support 16 by being integrally molded or formed together, chemically bonded, heat bonded or welded, coupled with adhesives, with clasp type fasteners, clip type fasteners, rivet type fasteners, threaded type fasteners, any other type of fastener, or otherwise coupled together.

As shown in FIGS. 9 and 10, in some embodiments, a barrier joining device 15 may comprise a female socket barrier joining device 15A and a barrier joining device 15 may also comprise a male barrier joining device 15B. In further embodiments, a female socket barrier joining device 15A coupled to a first horizontal support 16 is configured to engage or interlock with a male barrier joining device 15B coupled to a second horizontal support 16. A female socket barrier joining device 15A may comprise a generally elongated "C" shape. A male barrier joining device 15B may comprise a substantially elongated cylinder shape which is configured to enter the interior 27 of the female socket barrier joining device 15A to be pivotally secured within a female socket barrier joining device 15A. In alternative embodiments, a barrier joining device 15 may comprise any other fastener or coupling method which may allow a first barrier joining device 15 to be secured to a second barrier joining device 15.

Figure 11:
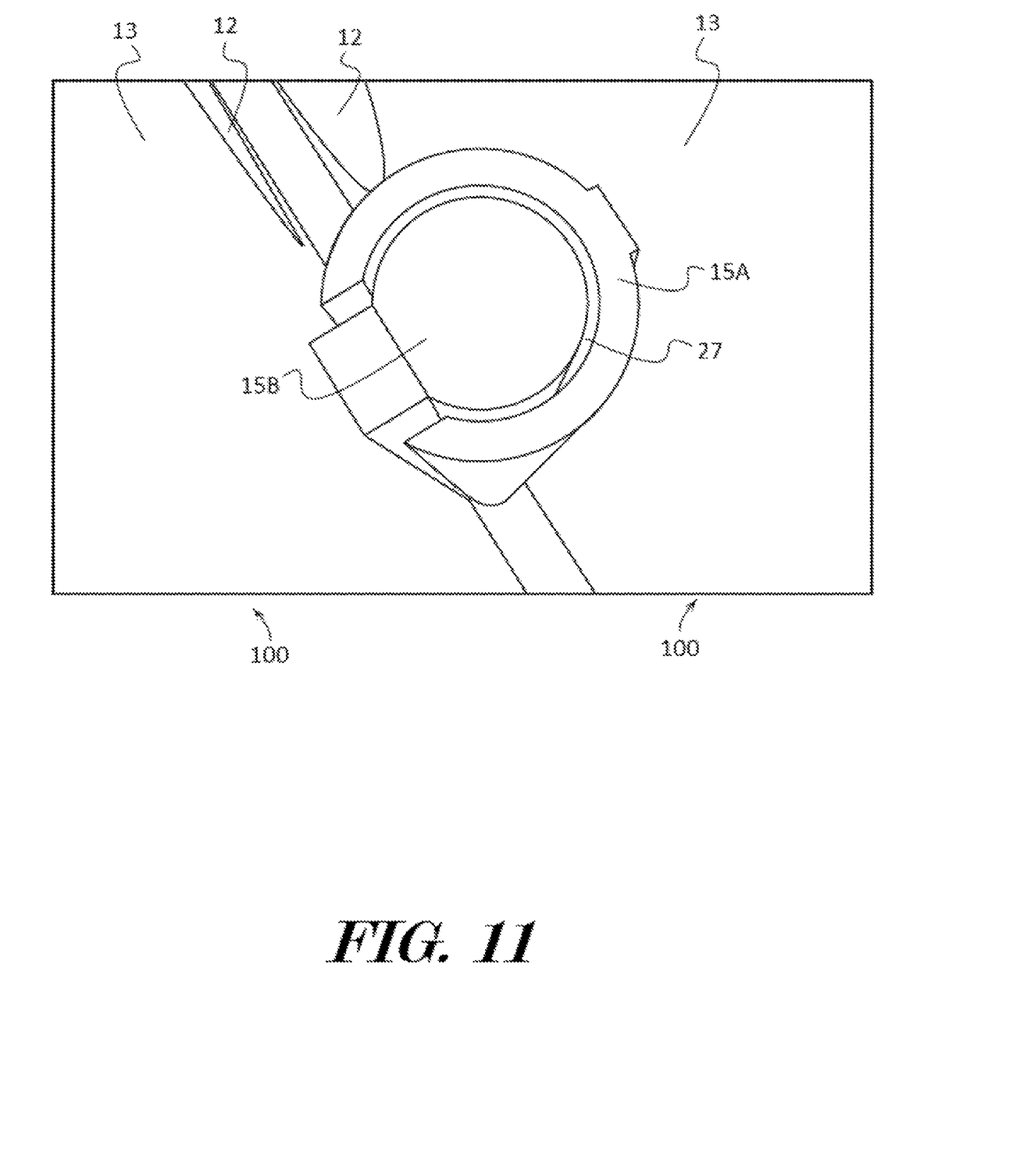
FIG. 11 illustrates an elevation view of two examples of barrier joining devices secured together according to various embodiments described herein.

FIG. 11 illustrates an elevation view of two examples of barrier joining devices 15 secured together according to various alternative embodiments described herein. In this embodiment, the barrier joining devices 15 comprise a female socket barrier joining device 15A and a male barrier joining device 15B. The female socket barrier joining device 15A is shown interlocked and engaged with the male barrier joining device 15B. To secure a first system 100 comprising a female socket barrier joining device 15A coupled to and extending from a sidewall 13 to a second system 100 comprising a male barrier joining device 15B coupled to and extending from a sidewall 13, either system 100 may be lifted until its respective barrier joining device 15A, 15B, is positioned above the other barrier joining device 15A, 15B, and then lowered until the male barrier joining device 15B enters the female socket barrier joining device 15A. In preferred embodiments, each system 100 comprises one or more male barrier joining devices 15B at one end, such as on a first sidewall 13, and one or more female socket barrier joining devices 15A at an opposite end, such as on a second sidewall 13, allowing a series of systems 100 to be secured together as depicted in the modular recycled tire rubber barrier system 200 show in FIG. 2 by interlocking the female socket barrier joining device 15A of a first system 100 to the male barrier joining device 15B of a second system 100.

Figure 12:
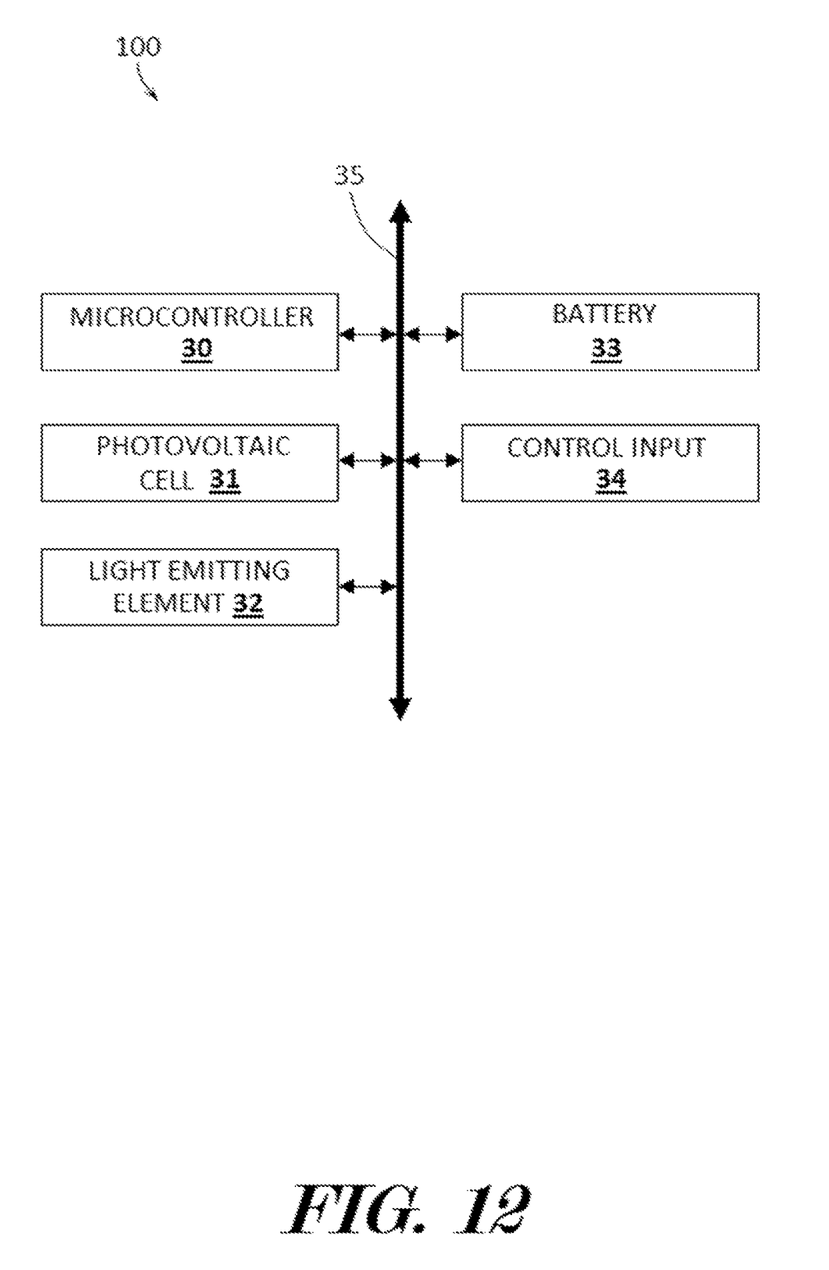
FIG. 12 depicts a block diagram showing some of the elements of an example of a recycled tire rubber barrier modular system according to various embodiments described herein.

FIG. 12 depicts a block diagram showing some of the optional electronic elements of an example of a recycled tire rubber barrier modular system 100 according to various embodiments described herein. In preferred embodiments, a system 100 may comprise one or more electronic components such as a microcontroller 30, a photovoltaic cell 31, a light emitting element 32, an optional battery 33, and/or an optional control input 34. The electronic elements 30, 31, 32, 33, 34, may be communicatively coupled together via a local interface 35 to provide electronic communication between the electronic elements 30, 31, 32, 33, 34. In some embodiments, a lateral hooking arm 14 (FIGS. 1-4, 6, and 8) may comprise a plurality light emitting elements 32, and a microcontroller 30 may be configured to control the light emitted by the plurality light emitting elements 32.

The local interface 35 can be, for example but not limited to, one or more buses or other wired or wireless connections, as is known in the art. The local interface 35 can have additional elements, which are omitted for simplicity, such as controllers, buffers (caches), drivers, repeaters, and receivers, among many others, to enable communications. Further, the local interface 35 may include address, control, and/or data connections to enable appropriate communications among the aforementioned components. In some embodiments, a local interface 35 may comprise a printed circuit board (PCB) which mechanically supports and electrically connects electronic components using conductive tracks, pads and other features etched from copper sheets laminated onto a non-conductive substrate. PCBs can be single sided (one copper layer), double sided (two copper layers) or multi-layer. Conductors on different layers may be connected with plated-through holes called vias. In some embodiments, a local interface 35 may only comprise copper connections and no embedded components and may be called a printed wiring board (PWB) or etched wiring board. In other embodiments, a local interface 35 may comprise a printed circuit assembly (PCA), printed circuit board assembly or PCB assembly (PCBA), a circuit card assembly (CCA), or a backplane assembly, or any other suitable electrical connection and communication method including standard wiring and the like.

A microcontroller 30 may be configured to control the light emitted by one or more light emitting elements 32, and optionally to control functions of one or more photovoltaic cells 31, batteries 33, and/or control inputs 34. In some embodiments, a microcontroller 30 may comprise a Light Emitting Diode (LED) driver which may further comprise a small computer on a single integrated circuit or chip containing a processor core, memory, and programmable input/output peripherals. Program memory in the form of NOR flash or OTP ROM is may be included on chip, as well as a typically small amount of RAM. In other embodiments, other controllers designed for embedded applications may be used to illuminate the light emitting elements 32. In preferred embodiments, the microcontroller 30 and one or more light emitting elements 32 are supplied power from a photovoltaic cell 31 and/or battery 33.

The system 100 may comprise one or more photovoltaic cells 31, such as a photovoltaic array, which may be configured to provide power to a microcontroller 30, light emitting elements 32, battery 33, and/or control input 34 via a local interface 35. A photovoltaic cell 31 may comprise any electrical device, such as a solar cell, that converts the energy of light directly into electricity by the photovoltaic effect, such as Crystalline silicon photovoltaic cells, Thin Film photovoltaic cells, Multi junction photovoltaic cells, Perovskite solar cells, Liquid inks, Quantum dot solar cells, Dye-sensitized solar cells, Photon upconversion and down-conversion solar cells, Organic/polymer solar cells, and Adaptive solar cells. The system 100 may comprise one or more a photovoltaic cells 31 which may be positioned on the convex upper elongate surface 18 (FIGS. 1-4, and 6-8) and which may be in electrical communication with a light emitting element 32.

The system 100 may comprise one or more light emitting elements 32, which may be configured to illuminate with various colors and intensities of light allowing a plurality of color patterns and intensity patterns to be generated by the system 100. The system 100 may comprise one, two, three, four, five, six, seven, eight, or more light emitting elements 32, such as a plurality of light emitting elements 32. In some embodiments, a light emitting element 32 may comprise a light emitting diode (LED) which may be configured to provide light of various wavelengths and intensities. In other embodiments, a light emitting element 32 may comprise an organic light-emitting diode (OLED), incandescent light bulb, fluorescent light, bulb halogen light bulb, high-intensity discharge light bulb, laser light emitter, electroluminescent light source, neon light source, or any other type of suitable light source. In some embodiments, a microcontroller 30 may control the light emitted by the plurality light emitting elements 32, such as by controlling the color and/or intensity of the light emitted by the light emitting elements 32.

The system 100 may optionally comprise one or more batteries 33 which may provide electrical power to an element 30, 32, 34, 35, that may require electrical power, such as when one or more photovoltaic cells 31 are unable to provide electrical power. A battery 33 may comprise a lithium ion battery, nickel cadmium battery, alkaline battery, or any other suitable type of rechargeable or non-rechargeable battery 33 which may or may not be removable from the system 100.

The system 100 may optionally comprise one or more user control inputs 34 that a user may interact with, such as turnable control knobs, depressable button type switches, slide type switches, rocker type switches, or any other suitable input that may be used to modulate electricity between one or more electrical components 30, 31, 32, 33, 35. In this manner, the user control inputs 34 may be configured to modulate functions of the microcontroller 30 and/or the illumination intensity and illumination color of one or more light emitting elements 32.

Figure 13:
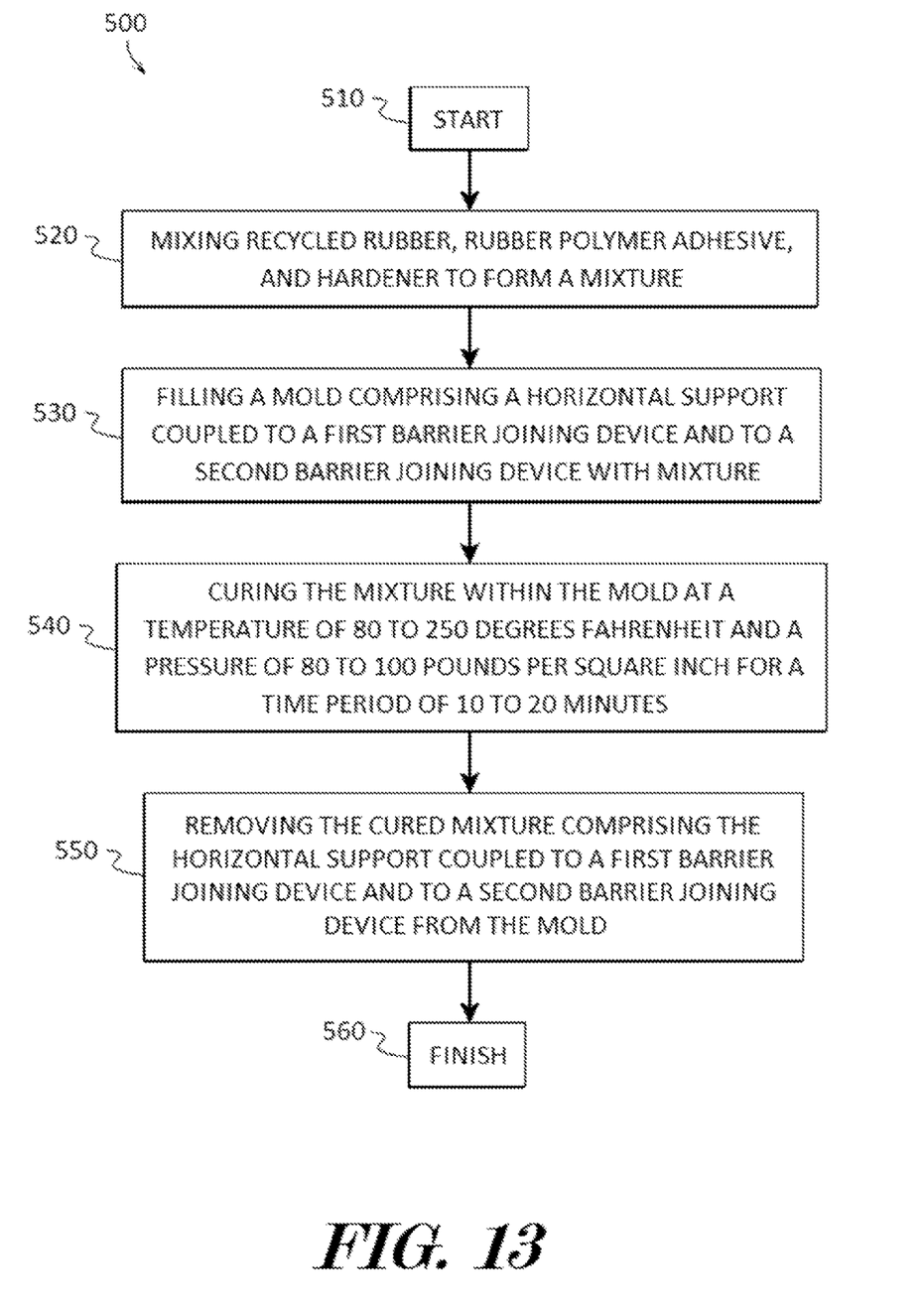
FIG. 13 shows a block diagram of an example of a method of making a recycled tire rubber barrier modular system according to various embodiments described herein.

FIG. 13 shows a block diagram of an example of a method of making a recycled tire rubber barrier modular system ("the method") 500 according to various embodiments described herein. The method 500 of making a system 100 (FIGS. 1-8) may start by mixing recycled rubber, rubber polymer adhesive, and optional hardener to form a mixture in step 520. In some embodiments, recycled rubber may comprise reclaimed or recycled automotive or vehicular tire rubber, and the mixture may comprise approximately 97 to 99 percent ground, mulched, nugget sized, granule sized, titurated, or other forms of particulate tire rubber, and approximately three percent of less of a polymer adhesive. In some embodiments, a rubber polymer adhesive (binder) may comprise a Polyurethane Rubber Binder, such as Flexithane, an optionally moisture cured polyurethane binder which may be based on diphenylmethane diisocyanate, such as GN-410, GN-416, GN-417, GN-420, GN-1405, SL-Series, an optionally moisture cured polyurethane binder which may be based on aliphatic polyurethane prepolymer, such as SL-8076, other Aromatic polyurethane binders, other Aliphatic polyurethane binders, or any other adhesive or binder which may be suitable for binding the particulate rubber together. In further embodiments, the mixture may comprise three percent or less of adhesive. In some embodiments, an optional hardener may comprise water, or any other material which may facilitate the hardening of the binder or adhesive. In further embodiments, the mixture may comprise one ounce of a hardener, such as water, for every three pounds of recycled rubber particulate, such as one-eighth of an inch recycled rubber triturates. In still further embodiments, the mixture may comprise colors or pigments which may be used to tint or color the mixture and may be added in step 520.

Next, in step 530 a mold comprising a horizontal support 16 (FIGS. 7-10) coupled to a first barrier joining device 15, such as a male barrier joining device 15B (FIGS. 9-11), and to a second barrier joining device 15, such as a female socket barrier joining device 15A (FIGS. 9-11), may be filled with the mixture. In some embodiments, the mold may comprise a photovoltaic cell 31 (FIGS. 1, 2, 4, 6-8, and 12) and a light emitting element 32 (FIGS. 1, 2, 4, 6, 8, and 12) in electrical communication with each other. In further embodiments, the mold comprises a microcontroller 30 (FIG. 12), a photovoltaic cell 31, and a plurality light emitting elements 32, and the microcontroller 30 may be in electric communication with the photovoltaic cell 31 and the plurality light emitting elements 32, and the microcontroller 30 may be configured to control the light emitted by the plurality light emitting elements 32. In still further embodiments, the mold is configured to form a modular recycled tire rubber barrier comprising; an elongated core 26 (FIGS. 7 and 8) of recycled rubber, polymer adhesive, and hardener; a base 11 (FIGS. 1-8) coupled to the elongated core 26; a concave elongate wall 12 (FIGS. 1-4, 6, and 7), and the concave elongate wall 12 may be coupled to the elongated core 26 and to the base 11; two oppositely positioned sidewalls 13 (FIGS. 1-3, 6, 7, and 11), and the sidewalls 13 may each be coupled to the elongated core 26 and to the base 11, and each sidewall 13 may be joined to the concave elongate wall; a lateral hooking arm 14 (FIGS. 1-4, 6, and 8) coupled to the elongated core 26, and the lateral hooking arm 14 may be coupled to the top of the concave elongate wall 12 and coupled to both sidewalls 13; a barrier joining device 15 (FIGS. 1-4, 6-11) coupled to each sidewall 13; and a horizontal support 16 (FIGS. 7-10) centrally disposed within the elongated core 26 and coupled to both barrier joining devices 15.

In some embodiments, the mold is configured to form a modular recycled tire rubber barrier comprising; an elongated core 26 (FIGS. 7 and 8) of recycled rubber, polymer adhesive, and hardener; a base 11 (FIGS. 1-8) coupled to the elongated core 26; two parallel and oppositely positioned concave elongate walls 12 (FIGS. 1-4, 6, and 7), and each of the concave elongate walls 12 may be coupled to the elongated core 26 and to the base 11; two parallel and oppositely positioned sidewalls 13 (FIGS. 1-3, 6, 7, and 11), and the sidewalls 13 may each be coupled to the elongated core 26 and to the base 11, and each sidewall 13 may be joined to both of the concave elongate walls 12; two lateral hooking arms 14 (FIGS. 1-4, 6, and 8) coupled to the elongated core 26, and each lateral hooking arm 14 may be coupled to the top of the concave elongate wall 12 and coupled to both sidewalls 13; a barrier joining device 15 (FIGS. 1-4, 6-11) coupled to each sidewall 13; and a horizontal support 16 (FIGS. 7-10) centrally disposed within the elongated core 26 and coupled to both barrier joining devices 15.

In step 540 and in some embodiments, the mixture may be cured within the mold at a temperature of 80 to 250 degrees Fahrenheit and a pressure of 80 to 100 pounds per square inch for a time period of 10 to 20 minutes. In other embodiments, the mixture may be cured within the mold at a temperature of 80 to 100 degrees Fahrenheit and a pressure of 85 to 95 pounds per square inch for a time period of 10 to 15 minutes.

Next in step 550, the cured mixture comprising the horizontal support 16 (FIGS. 7-10) coupled to a first barrier joining device 15 (FIGS. 1-4, 6-11) and to a second barrier joining device 15 may be removed from the mold and the method 500 may finish 560. In further embodiments, the cured mixture comprising the horizontal support 16 (FIGS. 7-10) coupled to a first barrier joining device 15 (FIGS. 1-4, 6-11) and to a second barrier joining device 15, and a microcontroller 30 (FIG. 12) in electric communication with a photovoltaic cell 31 (FIGS. 1, 2, 4, 6-8, and 12) and the plurality light emitting elements 32 (FIGS. 1, 2, 4, 6, 8, and 12) may be removed from the mold and the method 500 may finish 560.

While some materials have been provided, in other embodiments, one or more of the elements that may comprise the system 100 may be made from durable materials such as aluminum, steel, other metals and metal alloys, wood, hard rubbers, hard plastics, fiber reinforced plastics, carbon fiber, fiber glass, resins, polymers or any other suitable materials including combinations of materials. Additionally, one or more elements may be made from or comprise durable and slightly flexible materials such as soft plastics, silicone, soft rubbers, or any other suitable materials including combinations of materials. In some embodiments, one or more of the elements that comprise the system 100 may be coupled or connected together with heat bonding, chemical bonding, adhesives, clasp type fasteners, clip type fasteners, rivet type fasteners, threaded type fasteners, other types of fasteners, or any other suitable joining method. In other embodiments, one or more of the elements that comprise the system 100 may be coupled or removably connected by being press fit or snap fit together, by one or more fasteners such as hook and loop type or Velcro® fasteners, magnetic type fasteners, threaded type fasteners, sealable tongue and groove fasteners, snap fasteners, clip type fasteners, clasp type fasteners, ratchet type fasteners, a push-to-lock type connection method, a turn-to-lock type connection method, slide-to-lock type connection method or any other suitable temporary connection method as one reasonably skilled in the art could envision to serve the same function. In further embodiments, one or more of the elements that comprise the system 100 may be coupled by being one of connected to and integrally formed with another element of the system 100.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A recycled tire rubber barrier modular system, the system comprising:
   an elongated core of recycled rubber, the recycled rubber comprising recycled tire rubber particles;
   a polymer adhesive mixed with the recycled tire rubber particles;
   a base coupled to and extending along a bottom portion of the elongated core;
   a first concave elongate wall and a second concave elongate wall oppositely positioned to the first concave elongate wall, wherein each concave elongate wall is coupled to the elongated core and to the base;
   two oppositely positioned sidewalls, wherein the sidewalls are each coupled to the elongated core and to the base, and wherein each sidewall is joined to a concave elongate wall; and
   a first lateral hooking arm extending outwardly away from the first concave elongate wall, the first lateral hooking arm comprising a first planar engagement surface, the first planer engagement surface orientated parallel to the base and configured to arrest the upward movement of a vehicle striking the first lateral hooking arm, and
   a second lateral hooking arm extending outwardly away from the second concave elongate wall, the second lateral hooking arm comprising a second planar engagement surface, the second planer engagement surface orientated parallel to the base and configured to arrest the upward movement of a vehicle striking the second lateral hooking arm.

2. The system of claim 1, wherein the base comprises a scup configured to allow water and debris to pass under the system.

3. The system of claim 1, wherein a lateral hooking arm comprises a light emitting element.

4. The system of claim 3, further comprising a photovoltaic cell in electrical communication with a light emitting element.

5. The system of claim 1, wherein a lateral hooking arm comprises a plurality light emitting elements, and wherein the system comprises a microcontroller configured to control the light emitted by the plurality light emitting elements.

6. The system of claim 1, wherein the horizontal support comprises a cable coupled to each barrier joining device.

7. The system of claim 1, further comprising a male barrier joining device and a female socket barrier joining device, wherein the male barrier joining device of the system is configured to interlock with a female socket barrier joining device of another system.

8. The system of claim 1, wherein the elongated core comprises between 97 and 99 percent rubber.

9. The system of claim 1, further comprising a convex upper elongate surface forming a top portion of the elongated core, wherein the convex upper elongate surface is positioned equidistantly between the first lateral hooking arm and the second lateral hooking arm.

10. The system of claim 9, further comprising a light emitting element, wherein the convex upper elongate surface comprises a photovoltaic cell positioned at a pinnacle top of the convex upper elongate surface and the photovoltaic cell is in electrical communication with the light emitting element.

11. The system of claim 1, further comprising a convex upper surface forming a convex radius top distal end of the elongated core, the convex radius top is positioned equally between the first and the second lateral hocking arms and the convex radius top extends upwardly in a vertical direction away from the base.

12. The system of claim 11, further comprising a photovoltaic cell positioned along the convex upper radius top of the convex upper surface.

13. The system of claim 12, wherein the photovoltaic cell is in electrical communication with a light emitting element and the light emitting element is positioned along a lateral hocking arm.

14. The system of claim 1, wherein the first concave elongate wall is a mirror image of the second concave elongate wall.

15. The system of claim 1, wherein the elongated core comprises 100% recycled rubber without virgin rubber.

* * * * *